United States Patent
Lesák et al.

(10) Patent No.: US 10,670,427 B2
(45) Date of Patent: Jun. 2, 2020

(54) CAPACITIVE SENSOR ARRANGEMENT AND VEHICLE OUTER HANDLE

(71) Applicant: WITTE Automotive GmbH, Velbert (DE)

(72) Inventors: Vit Lesák, Praha-Bohnice (CZ); Pavel Skála, Nejdek (CZ); Radek Dučka, Jirkov (CZ)

(73) Assignee: WITTE AUTOMOTIVE GMBH, Velbert (DE)

( * ) Notice: Subject to any disclaimer, the term of this patent is extended or adjusted under 35 U.S.C. 154(b) by 0 days.

(21) Appl. No.: 16/119,221

(22) Filed: Aug. 31, 2018

(65) Prior Publication Data

US 2019/0072415 A1    Mar. 7, 2019

(30) Foreign Application Priority Data

Sep. 1, 2017    (DE) .................. 10 2017 215 333

(51) Int. Cl.
*G01R 27/26*    (2006.01)
*G01D 5/24*    (2006.01)
(Continued)

(52) U.S. Cl.
CPC .......... *G01D 5/2405* (2013.01); *G01N 27/22* (2013.01); *G01N 27/221* (2013.01);
(Continued)

(58) Field of Classification Search
CPC .... G01N 27/22; G01N 27/221; G01N 27/226; G06F 3/044; G06F 3/0416;
(Continued)

(56) References Cited

U.S. PATENT DOCUMENTS

2008/0211213 A1*  9/2008  Launay .............. G01D 5/2405
                                                         280/735
2014/0015595 A1   1/2014  Van Ausoall
(Continued)

FOREIGN PATENT DOCUMENTS

DE    20 2005 015 210 U1    3/2006
DE    10 2005 038 678 A1    2/2007
(Continued)

OTHER PUBLICATIONS

DE 102011010919 machine translation, Aug. 11, 2011 (Year: 2011).*
WO 2014032988 machine translation, Mar. 6, 2014 (Year: 2014).*

*Primary Examiner* — Raul J Rios Russo
(74) *Attorney, Agent, or Firm* — McGlew and Tuttle, P.C.

(57) ABSTRACT

A capacitive sensor arrangement (4), for sensing an approaching object (5), is configured as a contact sensor (9) including a plurality of aligned, flat, spaced apart electrodes (4.1 to 4.*n*). One electrode (4.1) is a main electrode (S) and other electrodes are auxiliary electrodes (H). The evaluation unit (6) monitors the electrodes (4.1 to 4.*n*) together, such that changes in the capacitances of the plurality of auxiliary electrodes and changes in the capacitance of the main electrode are sensed and compared with one another and/or are compared with prescribed reference values. The evaluation unit (6) plausibility checks the sensed changes (D(S)) in the capacitance of the main electrode (S) on the basis of the sensed changes (D(H)) in the capacitances of the plurality of auxiliary electrodes (H) as to whether or not contacting of the main electrode or an approach towards the main electrode (S) has taken place.

20 Claims, 3 Drawing Sheets

(51) Int. Cl.
*H03K 17/96* (2006.01)
*H03K 17/955* (2006.01)
*G01N 27/22* (2006.01)
*G06F 3/041* (2006.01)
*G06F 3/044* (2006.01)
*G01R 17/16* (2006.01)
*B60R 25/20* (2013.01)

(52) U.S. Cl.
CPC ........... *G01N 27/226* (2013.01); *G01R 27/26* (2013.01); *G01R 27/2605* (2013.01); *G06F 3/044* (2013.01); *G06F 3/0416* (2013.01); *H03K 17/955* (2013.01); *H03K 17/9622* (2013.01); *B60R 25/20* (2013.01); *G01R 17/16* (2013.01); *G06F 2203/04103* (2013.01); *H03K 2217/96073* (2013.01); *H03K 2217/96078* (2013.01); *H03K 2217/960705* (2013.01)

(58) Field of Classification Search
CPC ...... G06F 2203/04103; G01R 27/2605; G01R 27/26; G01R 17/16
USPC ... 324/76.11–76.83, 459, 600, 649, 658, 663
See application file for complete search history.

(56) References Cited

U.S. PATENT DOCUMENTS

| | | | |
|---|---|---|---|
| 2015/0224952 A1* | 8/2015 | Ootaka | B60R 21/01532 324/663 |
| 2015/0370369 A1* | 12/2015 | Kuo | G06F 3/044 345/174 |
| 2016/0085368 A1 | 3/2016 | Lee | |
| 2018/0080802 A1* | 3/2018 | Urig | B60N 2/002 |
| 2019/0047502 A1* | 2/2019 | Lamesch | B60N 2/002 |

FOREIGN PATENT DOCUMENTS

| | | |
|---|---|---|
| DE | 10 2007 021 812 A1 | 11/2008 |
| DE | 10 2007 048 402 A1 | 4/2009 |
| DE | 102007051495 A1 | 5/2009 |
| DE | 10 2011 010 919 A1 | 8/2011 |
| DE | 20 2015 004 832 U1 | 10/2016 |
| DE | 10 2015 014 317 A1 | 5/2017 |
| EP | 1 235 190 B1 | 1/2005 |
| EP | 2 187 241 A1 | 5/2010 |
| JP | 2012129762 A | 7/2012 |
| WO | 2007/020058 A1 | 2/2007 |
| WO | 2014/011436 A1 | 1/2014 |
| WO | 2014032988 A1 | 3/2014 |

* cited by examiner

CAPACITIVE SENSOR ARRANGEMENT AND VEHICLE OUTER HANDLE

CROSS REFERENCE TO RELATED APPLICATIONS

This application claims the benefit of priority under 35 U.S.C. § 119 of German Application 10 2017 215 333.4, filed Sep. 1, 2017, the entire contents of which are incorporated herein by reference.

TECHNICAL FIELD

The invention relates to a capacitive sensor arrangement for sensing at least one approaching object, a vehicle outer surface and a vehicle outer handle having such a capacitive sensor arrangement.

BACKGROUND

Capacitive sensor arrangements are known in general as proximity or contact sensors for capacitive touch recognition, in order for example to recognize an approaching hand or the presence of a hand/manual operation at a handle, such as a vehicle outer handle, and to release or to block a function, such as a locking or unlocking function.

In the case of a vehicle outer handle, one particular disadvantage is erroneous recognitions, caused for example by heavy rain, possibly resulting in undesired activation of a locking or unlocking function.

SUMMARY OF THE INVENTION

The invention is based on an object of specifying a capacitive sensor arrangement for sensing at least one approaching object, by way of which sensor arrangement erroneous recognitions and/or erroneous activations are largely avoided. A vehicle outer surface and a vehicle outer handle having an improved capacitive sensor arrangement are also to be specified.

The capacitive sensor arrangement according to the invention for sensing at least one approaching object is configured as a contact sensor and comprises a plurality of electrodes that are each configured as flat electrodes and aligned with one another and arranged spaced apart from one another, wherein each electrode has a prescribed capacitance and is connected to an evaluation unit, which senses changes in the capacitance of the respective electrode, wherein one of the electrodes is configured as a main electrode and the other electrodes are configured as auxiliary electrodes, wherein the evaluation unit is configured to monitor all of the electrodes together, such that changes in the capacitances of the plurality of auxiliary electrodes and changes in the capacitance of the main electrode are sensed and compared with one another. Furthermore, the evaluation unit is configured to check the sensed changes in the capacitance of the main electrode on the basis of the sensed changes in the capacitances of the plurality of auxiliary electrodes in terms of plausibility and/or consistency as to whether or not contacting of the main electrode or an approach towards the main electrode has taken place.

By checking the sensed changes in capacitance of the main electrode in comparison with the sensed changes in capacitance of the plurality of auxiliary electrodes by means of a plausibility test, operating contact is able to be identified reliably and unambiguously. In particular, it is possible to filter out erroneous activations/contact, caused for example by dirty water, rain, spray or the like. False operations or false activations are thus avoided. To this end, the respective switching function is blocked by the plausibility test when an erroneous activation is identified, for example.

The capacitive sensor arrangement is configured in particular as a contact sensor, which changes its capacitance when it is contacted by an object or when it is approached by an object.

The advantages obtained with the invention consist in particular in that, on account of the provision of auxiliary electrodes in addition to the main or measuring electrode, the sensed measurement or sensor signal, in particular the sensed change in the capacitance of the main electrode, is able to be checked in terms of plausibility by the sensed measurement or sensor signals, in particular by their sensed changes in the capacitances of the auxiliary electrodes. As a result, reliable activation or reliable blocking of a switching function, such as an unlocking or locking function, is made possible in the event of an identified contacting or approach of an object with or towards the main electrode. In particular, the surroundings of the main electrode are monitored by way of the auxiliary electrodes. In the event of reliable recognition of contacting of the main electrode, a control signal is then activated by way of the evaluation unit, for example, which control signal controls, for example activates or blocks, a corresponding function, such as a closing, opening, unlocking or locking function.

For example, the evaluation unit is configured, in the event of a determined lack of plausibility, to block activation of a function, such as for example a switching function or, in the event of a determined presence of plausibility, to release activation of the function, such as for example the switching function.

One development makes provision for example for the evaluation unit to be configured to activate a switching signal depending on the determined changes in the capacitance of the main electrode and/or auxiliary electrodes or to block such an activation of a switching signal.

In one possible embodiment, the electrodes are configured as strip electrodes and/or rectangular electrodes. For example, the main electrode has larger dimensions than the auxiliary electrodes. In particular, the main electrode has a size, shape and/or dimensions tailored to the approaching object. If for example an approach of and/or contact with a hand or a finger is intended to be sensed by way of the main electrode, then the main electrode may have for example a cushion like shape for the hand or a strip like shape for the finger. In this case, the main electrode serves as a measuring electrode that has to be actuated or contacted to trigger a function.

In the case of a capacitive sensor arrangement arranged for example externally on a vehicle, the evaluation unit makes it possible to activate different functions of the vehicle, such as for example opening or closing a vehicle door, unlocking or locking a tailgate or front cover lock, opening or closing a tailgate or front cover.

The auxiliary electrodes serve in particular to monitor the surroundings of the main or measuring electrode. For example, the auxiliary electrodes are used to recognize erroneous signals, caused for example by mechanical stress, such as dust, rain or dirt, and to suppress erroneous activation, in that activation of the function is blocked or suppressed.

A further embodiment makes provision for the auxiliary electrodes to be configured as strip electrodes and to be arranged in each case next to the main electrode. For example, the respective auxiliary or strip electrodes have a length that corresponds to a lateral length of the main electrode. In one possible embodiment, at least two of the auxiliary or strip electrodes are aligned vertically and arranged laterally with respect to the main electrode, parallel to the sides thereof. In addition, at least one of the auxiliary electrodes may be aligned horizontally and arranged above and/or below the main electrode, parallel thereto. Such an arrangement of auxiliary electrodes provided partly or completely around the main electrode enables corresponding partial or complete monitoring and sensing of the surroundings of the main electrode. As a result, the measurement signal of the main electrode is able to be checked reliably on the basis of the measurement signals from the surroundings and evaluated in terms of plausibility.

For example, in the event of a sensed change in the capacitance in the main electrode beyond a prescribed reference value, the evaluation unit emits a switching signal for a function, for example a locking or unlocking function. In this case, in the event of a sensed change in the capacitance only in the electrodes next to the main electrode, the evaluation unit may block the activation of a switching signal. As an alternative, in the event of sensing of changes in the capacitance in all of the electrodes, a function may be activated only if at least the reference value for the capacitance of the main electrode is exceeded.

Furthermore, the evaluation unit may be configured to determine and evaluate a temporal offset and/or a sequence of the changes in the capacitances of the main and/or auxiliary electrodes. Through such specific evaluation of the sensed changes in the capacitances, release conditions for the function may additionally be defined. Conclusions may also as a result be drawn as to conditions present in the surroundings of the main electrode or at the main electrode itself, such as for example as to heavy soiling of the sensor, wherein the evaluation unit may activate a corresponding maintenance signal or cleaning signal.

In particular, the evaluation unit is configured to check the determined temporal offset and/or the determined sequence of the changes in the capacitances of the main electrode and/or of the changes in the capacitances of the auxiliary electrodes in terms of plausibility as to whether or not contacting of the main electrode or an approach towards the main electrode has taken place.

The capacitive sensor arrangement is used in particular on an exterior, for example on a vehicle outer surface, for example on an A-pillar or on a handle of a vehicle. For example, a vehicle outer handle, which is exposed in particular to heavy soiling, rain or other stresses, is provided with such a capacitive sensor arrangement.

Exemplary embodiments of the invention are explained in more detail below with reference to drawings. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF PREFERRED EMBODIMENTS

Referring to the drawings, mutually corresponding parts are provided in all figures with the same reference signs.

Figure 1A:
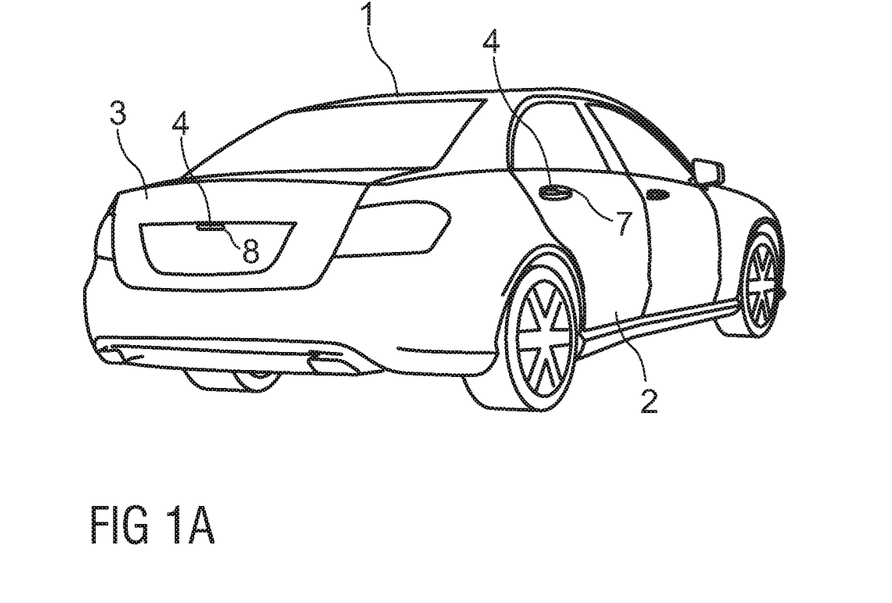
FIG. 1A is a schematic perspective view showing a vehicle having an externally arranged capacitive sensor arrangement.

FIG. 1A schematically shows a vehicle 1. The vehicle 1 has a plurality of electronically switchable regions on the outside thereof. For example, the vehicle 1 has, in the region of a door 2 or of a tailgate 3, a capacitive sensor arrangement 4 for sensing at least one object 5 approaching or contacting it, such as the hand of a user.

The capacitive sensor arrangement 4 makes it possible, in a simple manner, to activate a corresponding function of the vehicle 1, such as for example opening or closing the door 2, closing and/or opening a bonnet, a sliding roof, a lifting roof, a vehicle window and/or a tank cover, unlocking or locking a tailgate or front cover lock, opening or closing the tailgate 3. For this purpose, the vehicle 1 may be fitted with a plurality of capacitive sensor arrangements 4.

The capacitive sensor arrangement 4 may for example be part of a vehicle outer handle 7 or a tailgate handle 8.

The invention is described in more detail below by way of example with reference to the vehicle outer handle 7. The capacitive sensor arrangement 4 of the tailgate handle 8 has an identical function and an identical construction.

Figure 1B:
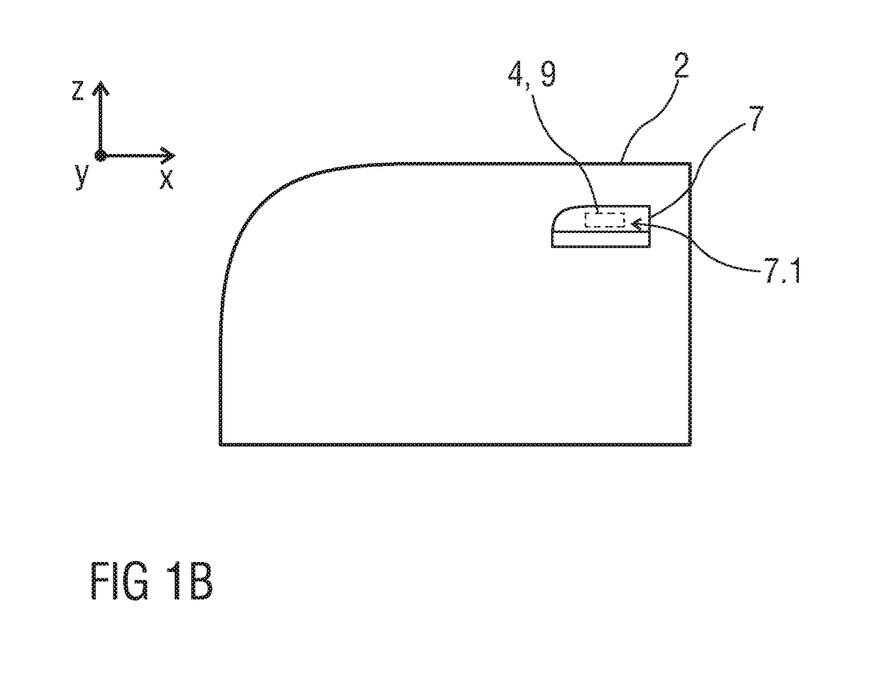
FIG. 1B is a schematic magnified view showing a vehicle door having a vehicle outer handle, which comprises a capacitive sensor arrangement as contact sensor.

FIG. 1B schematically shows, in a magnified view, the vehicle door 2 with the vehicle outer handle 7, which comprises the capacitive sensor arrangement 4, which is configured as a contact sensor 9. The contact sensor 9 is in this case an integral part of the vehicle outer handle 7. For example, the contact sensor 9 is integrated in a handle cover 7.1 of the vehicle outer handle 7, for example injected into a decorative outer layer, in particular a painted layer.

Figure 2:
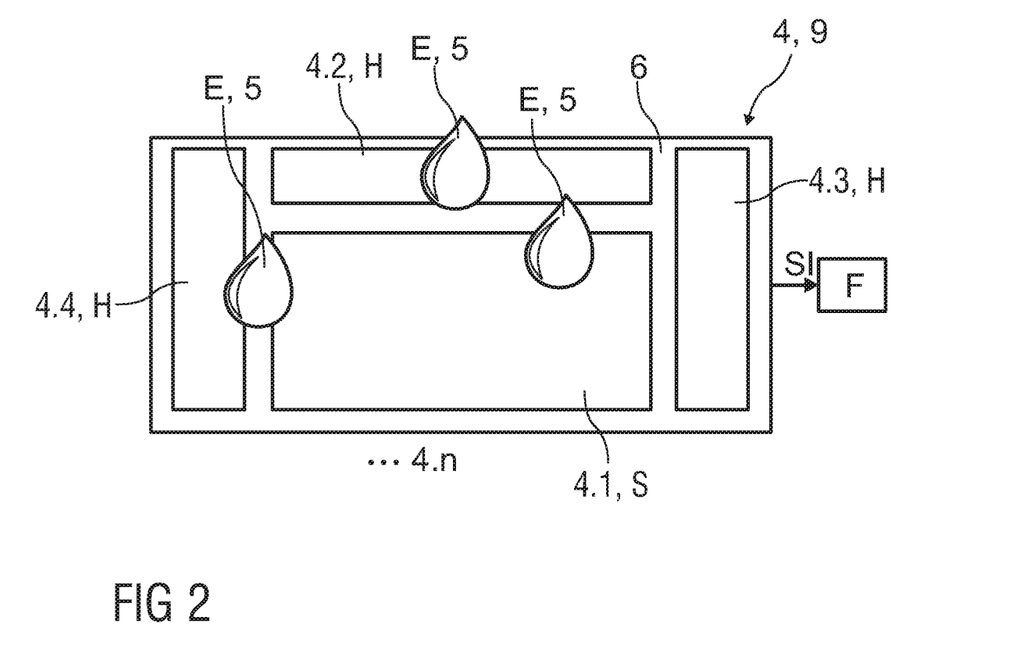
FIG. 2 is a schematic view showing one possible embodiment of a capacitive sensor arrangement in a first operating state.

FIG. 2 schematically shows an exemplary embodiment of the capacitive sensor arrangement 4 for sensing the object 5.

In this case, the capacitive sensor arrangement 4 comprises a plurality of electrodes 4.1 to 4.n, which are each configured as flat electrodes and are aligned with one another and arranged spaced apart from one another.

Each electrode 4.1 to 4.n has a prescribed capacitance. Depending on the type and design of the electrodes 4.1 to 4.n, the capacitive sensor arrangement 4 is configured as a contact sensor that reacts to the approach and/or contacting of the sensor by the object 5, in particular changes its capacitance. For example, in this case the changing electrical capacitance of the electrode 4.1 to 4.n is established in comparison with the surroundings or a reference electrode. For example, each electrode 4.1 to 4.n is configured as an oscillator, in particular an RC resonant circuit, which changes resonant frequency when the object 5 approaches, as a result of which the capacitance changes, which is sensed.

Each electrode 4.1 to 4.*n* is connected to an evaluation unit 6. The evaluation unit 6 is for example an integrated circuit or a microprocessor. The evaluation unit 6 senses, for example as a measurement signal, the changes in the capacitance or resonant frequency of the respective electrode 4.1 to 4.*n*.

In one simple embodiment, one of the electrodes 4.1 is configured as main electrode S (also sensor or measuring electrode). The other electrodes 4.2 to 4.*n* are configured as auxiliary electrodes H or reference electrodes.

The evaluation unit 6 is configured to monitor all of the electrodes 4.1 to 4.*n* together. For this purpose, the electrodes 4.1 to 4.*n* are coupled to the evaluation unit 6 in a conventional manner.

The evaluation unit 6 is configured such that changes in the capacitances of the plurality of auxiliary electrodes H and changes in the capacitance of the main electrode S are sensed and compared with one another.

For reliable activation or reliable blocking of a switching function, such as an unlocking or locking function, in the event of identified contacting or an approach of the object 5 with or towards the main electrode S, the auxiliary electrodes H are used to monitor the surroundings of the main electrode S.

In the event of reliable recognition of contacting of the main electrode S, a control signal SI is then activated by way of the evaluation unit 6, for example, which control signal controls, for example activates or blocks, a corresponding function F, such as a closing, opening, unlocking or locking function.

In this case, the evaluation unit 6 is configured to activate a switching or control signal SI depending on the determined changes in the capacitance of the main electrode S and/or auxiliary electrodes H, or to block such activation of a switching/control signal SI.

Figure 3:
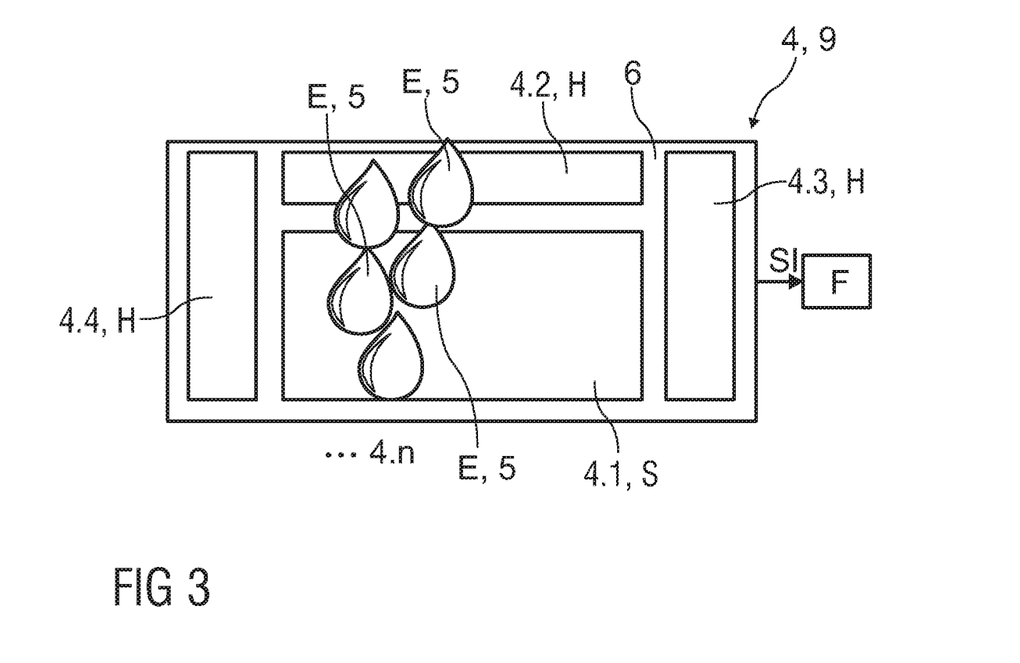
FIG. 3 is a schematic view showing the capacitive sensor arrangement in a second operating state.
Figure 4:
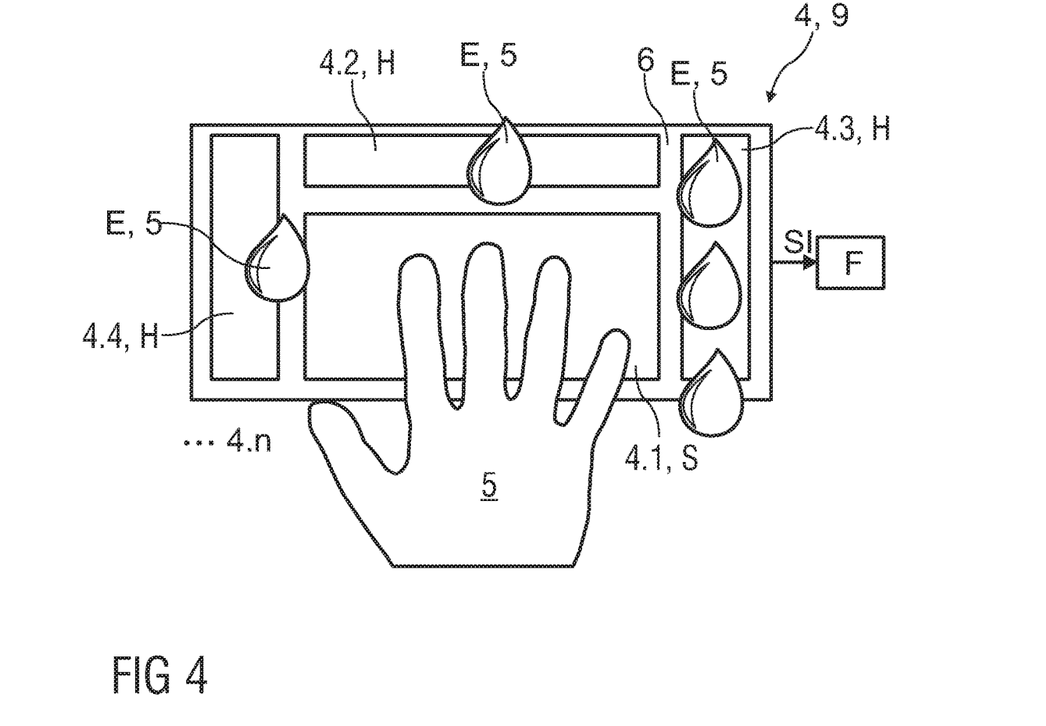
FIG. 4 is a schematic view showing the capacitive sensor arrangement in a third operating state.

FIGS. 2 to 4 show, by way of example, strip electrodes and/or rectangular electrodes as electrodes 4.1 to 4.*n*. For example, the main electrode S has larger dimensions than the auxiliary electrodes H. In particular, the main electrode S has a size, shape and/or dimensions tailored to the approaching object 5.

In the exemplary embodiment, the auxiliary electrodes H are configured as strip electrodes. However, the auxiliary electrodes H may also have another suitable shape.

The auxiliary electrodes H are in each case arranged next to the main electrode S. For example, the respective auxiliary electrodes H have a length that corresponds to a lateral length of the main electrode S.

In addition, the auxiliary electrodes H are arranged in a manner distributed around the main electrode S and at a distance therefrom.

In the exemplary embodiment shown, two of the auxiliary electrodes H (electrodes 4.3 and 4.4) are aligned vertically and arranged laterally with respect to the main electrode S, parallel to the sides thereof. In addition, a further auxiliary electrode H is aligned horizontally and arranged above the main electrode S, parallel thereto.

Through this arrangement of the auxiliary electrodes H provided partly around the main electrode S, at least partial monitoring and sensing of the surroundings of the main electrode S is enabled. As a result, the measurement signal of the main electrode S is able to be reliably checked and evaluated in terms of plausibility on the basis of the measurement signals of the auxiliary electrodes H and thus on the basis of signals from the surroundings of the main electrode S through comparison of the measurement signals with one another.

FIGS. 2 to 4 show a shape of the main electrode S, tailored to a hand, for sensing an approach and/or contact of the hand towards or on the main electrode S. For this purpose, the main electrode S has a cushion-like shape or a rectangular shape roughly the size of a hand. In this case, the main electrode S serves as a measuring electrode that has to be actuated or contacted to trigger the function F or that has to be approached.

The auxiliary electrodes H serve in particular to monitor the surroundings of the main electrode S. For example, the auxiliary electrodes H are used to recognize erroneous signals, caused for example by an effect E, in particular a mechanical stress or impact with dust, rain or dirt, and to suppress erroneous activation, in that activation of the function F is blocked or suppressed.

In FIG. 2, the evaluation unit 6 for example senses changes in the capacitance in the electrodes 4.1, 4.2 and 4.4 on account of an effect E caused by raindrops.

The evaluation unit 6 evaluates the sensed changes in the capacitances of the electrodes 4.1, 4.2 and 4.4. In this case, the determined values of the electrodes 4.1, 4.2 and 4.6 may be compared with one another. In addition, the determined values of the electrodes 4.1, 4.2 and 4.6 may also be compared with reference values stored for the respective electrode 4.1, 4.2 and 4.6. In this case, a plurality of reference values for differentiated recognition of objects 5 may be stored per electrode 4.1 to 4.*n*.

On account of the approximately equal change in the capacitances of the electrodes 4.1, 4.2 and 4.6, the evaluation unit 6 determines that merely an effect E in the form of raindrops on the capacitive sensor arrangement 4 is occurring, and that no functionally relevant approach of an object 5, such as a hand, is present, or contacting by an object 5 is present. As a result of this, the evaluation unit 6 does not generate a control signal SI.

In FIG. 3, the electrodes 4.1 and 4.2 detect an effect E. It is recognized, by way of the evaluation unit 6, that the reference value for activation of the control signal SI through the change in capacitance at the electrode 4.1, the main electrode S, is not reached. For this reason, generation of the control signal SI is stopped.

In FIG. 4, the capacitance of the main electrode S the electrode 4.1 changes, on account of a hand as approaching object 5, beyond the prescribed reference value and thus to a greater extent than the changes in the capacitances at the auxiliary electrodes H—the electrodes 4.2 to 4.4. By way of the evaluation unit 6, even in the event of an effect E caused by rain, it is thus possible to reliably sense an approach or contact of a desired object 5.

For this purpose, the evaluation unit 6 is for example configured, in the event of a sensed change in the capacitance in the main electrode S beyond a prescribed reference value, in spite of sensed changes in capacitance at the auxiliary electrodes H, to generate a control signal SI for a function F, for example a locking or unlocking function.

By contrast, if the change in capacitance sensed at the main electrode S undershoots a prescribed reference value, then no control signal SI is generated or activation thereof is blocked.

Furthermore, the evaluation unit 6 may be configured to determine and evaluate a temporal offset and/or a sequence of the changes in the capacitances of the main electrode S and/or auxiliary electrodes H. Through such specific evaluation of the sensed changes in the capacitances, release conditions for the function F may additionally be defined. Conclusions may also as a result be drawn as to conditions present in the surroundings of the main electrode S or at the main electrode S itself, such as for example as to heavy soiling of the sensor, wherein the evaluation unit 6 may activate a corresponding maintenance signal or cleaning signal.

Figure 5:
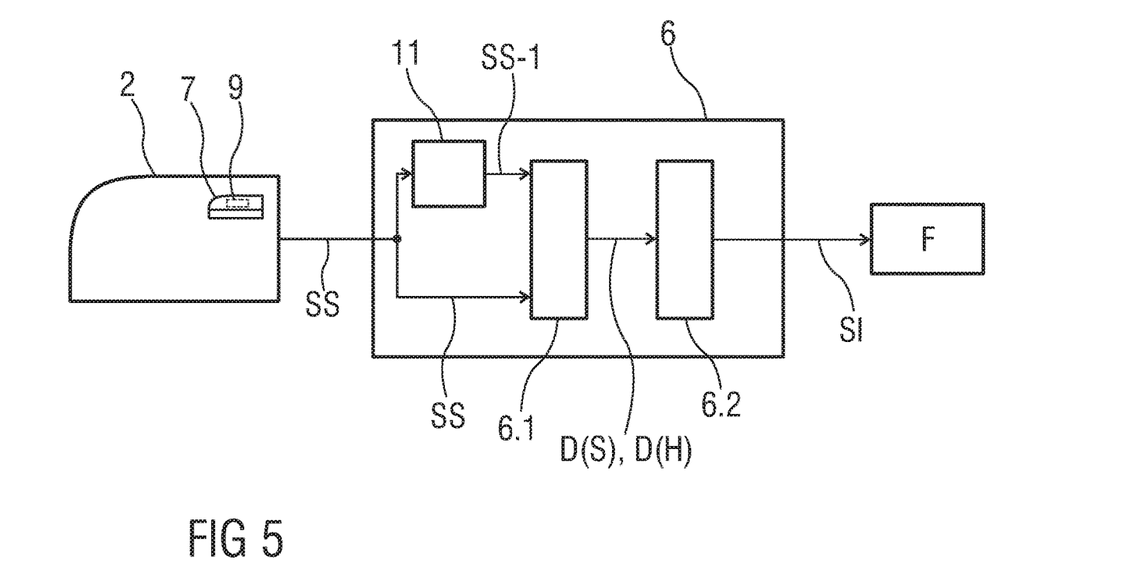
FIG. 5 is a schematic magnified view, a coupling of the capacitive sensor arrangement to an evaluation unit and a switching unit.

FIG. 5 schematically shows, in a magnified view, a coupling of the capacitive sensor arrangement 4 to an evaluation unit 6 and a switching unit 10.

The evaluation unit 6 is configured to monitor all of the electrodes 4.1 to 4.n together, such that changes in the capacitances of the plurality of auxiliary electrodes H and changes in the capacitance of the main electrode S are sensed and compared with one another and/or compared with prescribed reference values.

To this end, the electrodes 4.1 to 4.n supply the evaluation unit 6 with current measurement or sensor signals SS which are optionally stored as previous measurement or sensor signals SS-1. For example, to this end, the evaluation unit 6 comprises a storage unit 11. By means of the sensed current measurement or sensor signals SS and of the previous measurement or sensor signals SS-1, the evaluation unit 6 uses an analysis module 6.1 to determine changes D(S) in the capacitance of the main electrode S and changes D(H) in the capacitances of the plurality of auxiliary electrodes H.

Furthermore, the evaluation unit 6 may be configured to check the sensed changes D(S) in the capacitance of the main electrode S on the basis of the sensed changes D(H) in the capacitances of the plurality of auxiliary electrodes H in terms of plausibility as to whether or not contacting of the main electrode S and/or an approach towards the main electrode S has taken place. For this purpose, the evaluation unit 6 has for example a plausibility module 6.2.

For example, the evaluation unit 6, in particular its plausibility module 6.2, is configured to check a determined temporal offset and/or a determined sequence of the changes D(S) in the capacitances of the main electrode S and/or of the changes D(H) in the capacitances of the auxiliary electrodes H in terms of plausibility as to whether or not contacting of the main electrode S or an approach towards the main electrode S has taken place.

In this case, the evaluation unit 6 is furthermore configured, in the event of a determined lack of plausibility, to block activation of a function F, in particular a switching function or, in the event of a determined presence of plausibility, to release activation of the function F, in particular a switching function. For this purpose, the evaluation unit 6 is connected on the output side to the switching unit 10, which is supplied with a control signal SI by the evaluation unit 6 in order to activate or block the function F.

While specific embodiments of the invention have been shown and described in detail to illustrate the application of the principles of the invention, it will be understood that the invention may be embodied otherwise without departing from such principles.

APPENDIX

List of Reference Designations

1 Vehicle
2 Door
3 Tailgate
4 Capacitive sensor arrangement
4.1 to 4.n Electrode
5 Object
6 Evaluation unit
6.1 Analysis module
6.2 Plausibility module
7 Vehicle outer handle
7.1 Handle cover
8 Tailgate handle
9 Contact sensor
10 Switching unit
11 Storage unit
D(S) Changes in the capacitances of the main electrode
D(H) Changes in the capacitances of the auxiliary electrodes
E Effect
F Function
S Main electrode
SS Current measurement or sensor signal
SS-1 Previous measurement or sensor signal
SI Control signal
H Auxiliary electrode

What is claimed is:

1. A capacitive sensor arrangement for a vehicle for sensing at least one approaching object, the capacitive sensor arrangement comprising:
a contact sensor comprising a plurality of electrodes, each electrode being configured as a flat electrodes aligned with one another and arranged spaced apart from one another, wherein each electrode has a prescribed capacitance and one of the electrodes is a main electrode configured to release activation of a vehicle function if an approach of or contact with a hand or finger is identified and others of the electrodes are auxiliary electrodes configured to monitor surroundings of the main electrode; and
an evaluation unit connected to each of the electrodes and sensing changes in the capacitance of the respective electrode, wherein:
the evaluation unit is configured to monitor all of the electrodes together, such that changes in capacitances of the plurality of auxiliary electrodes and changes in the capacitance of the main electrode are sensed and compared with one another or are compared with prescribed reference values or are compared with one another and are compared with prescribed reference values; and
the evaluation unit is configured to plausibility check sensed changes in the capacitance of the main electrode on the basis of the sensed changes the capacitances of the plurality of auxiliary electrodes as to whether or not a contacting of the main electrode has taken place or an approach towards the main electrode has taken place.

2. A capacitive sensor arrangement according to claim 1, wherein the evaluation unit is configured, upon determining a lack of plausibility, to block activation of the vehicle function or, upon determining a presence of plausibility, to release activation of the vehicle function, the vehicle function comprising one or more of opening a vehicle component, closing the vehicle component, unlocking the vehicle component and locking the vehicle component.

3. A capacitive sensor arrangement according to claim 1, wherein the evaluation unit is configured to generate a control signal depending on determined changes in the capacitance of the main electrode or determined changes in the capacitance of the auxiliary electrodes or determined changes in the capacitance of the main electrode and determined changes in the capacitance of the auxiliary electrodes or to block such the generation of a control signal.

4. A capacitive sensor arrangement according to claim 1, wherein the electrodes are configured as strip electrodes or the electrodes are configured as rectangular electrodes or the electrodes are configured as strip electrodes and as rectangular electrodes.

5. A capacitive sensor arrangement according to claim 1, wherein the main electrode has larger dimensions than the auxiliary electrodes.

6. A capacitive sensor arrangement according to claim 1, wherein the auxiliary electrodes are configured as strip electrodes and are arranged in each case next to the main electrode.

7. A capacitive sensor arrangement according to claim 1, wherein each of respective auxiliary electrodes has at least a length that corresponds to a lateral length of the main electrode.

8. A capacitive sensor arrangement according to claim 1, wherein with a sensed change in capacitance in the main electrode, beyond a prescribed reference value, the evaluation unit emits a control signal.

9. A capacitive sensor arrangement according to claim 1, wherein, in the event of a sensed change in the capacitance only in the auxiliary electrodes next to the main electrode, the evaluation unit blocks activation of a control signal.

10. A capacitive sensor arrangement according to claim 1, wherein at least two of the auxiliary electrodes are aligned vertically and arranged laterally with respect to the main electrode, parallel to the sides thereof.

11. A capacitive sensor arrangement according to claim 1, wherein at least one of the auxiliary electrodes is aligned horizontally and arranged above the main electrode, parallel thereto.

12. A capacitive sensor arrangement according to claim 1, wherein the evaluation unit is configured to determine and evaluate a temporal offset of the main and/or auxiliary electrodes or to determine and evaluate a sequence of changes in capacitances of the main and/or auxiliary electrodes or determine and evaluate a temporal offset and a sequence of changes in capacitances of the main and/or auxiliary electrodes.

13. A capacitive sensor arrangement according to claim 12, wherein the evaluation unit is configured to plausibility check the determined temporal offset and/or the determined sequence of the changes in the capacitances of the main electrode and/or of the changes in the capacitances of auxiliary electrodes as to whether or not contacting of the main electrode has taken place or an approach towards the main electrode has taken place.

14. A vehicle outer surface comprising a capacitive sensor arrangement comprising:
   a contact sensor comprising a plurality of electrodes, each electrode being configured as a flat electrodes aligned with one another and arranged spaced apart from one another, wherein each electrode has a prescribed capacitance and one of the electrodes is a main electrode and others of the electrodes are auxiliary electrodes configured to monitor surroundings of the main electrode; and
   an evaluation unit connected to each of the electrodes and sensing changes in the capacitance of the respective electrode, wherein:
      the evaluation unit is configured to monitor all of the electrodes together, such that changes in capacitances of the plurality of auxiliary electrodes and changes in the capacitance of the main electrode are sensed and compared with one another or are compared with prescribed reference values or are compared with one another and are compared with prescribed reference values; and
      the evaluation unit is configured to plausibility check sensed changes in the capacitance of the main electrode on the basis of the sensed changes the capacitances of the plurality of auxiliary electrodes as to whether or not a contacting of the main electrode has taken place or an approach towards the main electrode has taken place, the main electrode being configured to release activation of a vehicle function if the contacting of the main electrode has taken place or the approach of a hand or a finger has taken place.

15. A vehicle outer surface according to claim 14, wherein the evaluation unit is configured to generate a control signal depending on determined changes in the capacitance of the main electrode or determined changes in the capacitance of the auxiliary electrodes or determined changes in the capacitance of the main electrode and determined changes in the capacitance of the auxiliary electrodes or to block such the generation of a control signal, the vehicle function comprising one or more of opening a vehicle component, closing the vehicle component, unlocking the vehicle component and locking the vehicle component.

16. A vehicle outer surface according to claim 14, wherein the evaluation unit is configured to determine and evaluate a temporal offset of the main and/or auxiliary electrodes or to determine and evaluate a sequence of changes in capacitances of the main and/or auxiliary electrodes or determine and evaluate a temporal offset and a sequence of changes in capacitances of the main and/or auxiliary electrodes.

17. A vehicle outer surface according to claim 16, wherein the evaluation unit is configured to plausibility check the determined temporal offset and/or the determined sequence of the changes in the capacitances of the main electrode and/or of the changes in the capacitances of auxiliary electrodes as to whether or not contacting of the main electrode has taken place or an approach towards the main electrode has taken place.

18. A vehicle outer handle comprising a capacitive sensor arrangement comprising:
   a contact sensor comprising a plurality of electrodes, each electrode being configured as a flat electrodes aligned with one another and arranged spaced apart from one another, wherein each electrode has a prescribed capacitance and one of the electrodes is a main electrode and others of the electrodes are auxiliary electrodes configured to monitor surroundings of the main electrode; and
   an evaluation unit connected to each of the electrodes and sensing changes in the capacitance of the respective electrode, wherein:
      the evaluation unit is configured to monitor all of the electrodes together, such that changes in capacitances of the plurality of auxiliary electrodes and changes in the capacitance of the main electrode are sensed and compared with one another or are compared with prescribed reference values or are compared with one another and are compared with prescribed reference values; and
      the evaluation unit is configured to plausibility check sensed changes in the capacitance of the main electrode on the basis of the sensed changes the capacitances of the plurality of auxiliary electrodes as to whether or not a contacting of the main electrode has taken place or an approach towards the main electrode has taken place, the main electrode being configured to release activation of a vehicle function if the contacting of the main electrode has taken place or the approach of a hand or a finger has taken place.

19. A vehicle outer handle according to claim 18, wherein the evaluation unit is configured to generate a control signal depending on determined changes in the capacitance of the main electrode or determined changes in the capacitance of the auxiliary electrodes or determined changes in the capacitance of the main electrode and determined changes in the capacitance of the auxiliary electrodes or to block such the generation of a control signal, the vehicle function comprising one or more of opening a vehicle component, closing the vehicle component, unlocking the vehicle component and locking the vehicle component.

20. A vehicle outer handle according to claim 18, wherein:
- the evaluation unit is configured to determine and evaluate a temporal offset of the main and/or auxiliary electrodes or to determine and evaluate a sequence of changes in capacitances of the main and/or auxiliary electrodes or determine and evaluate a temporal offset and a sequence of changes in capacitances of the main and/or auxiliary electrodes; and
- the evaluation unit is configured to plausibility check the determined temporal offset and/or the determined sequence of the changes in the capacitances of the main electrode and/or of the changes in the capacitances of auxiliary electrodes as to whether or not contacting of the main electrode has taken place or an approach towards the main electrode has taken place.

\* \* \* \* \*